(12) United States Patent
Nguyen et al.

(10) Patent No.: US 10,877,842 B2
(45) Date of Patent: Dec. 29, 2020

(54) DETECTING SILENT DATA CORRUPTION FOR MASS STORAGE DEVICES

(71) Applicant: Intel Corporation, Santa Clara, CA (US)

(72) Inventors: Tung Nguyen, Folsom, CA (US); Sri Krishna Karthik Koka, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 15/699,950

(22) Filed: Sep. 8, 2017

(65) Prior Publication Data

US 2019/0079827 A1 Mar. 14, 2019

(51) Int. Cl.
*G06F 11/10* (2006.01)
*H03M 13/29* (2006.01)

(52) U.S. Cl.
CPC ...... *G06F 11/1076* (2013.01); *G06F 11/1004* (2013.01); *H03M 13/2906* (2013.01)

(58) Field of Classification Search
CPC ............ G06F 11/1076; G06F 11/1004; H03M 13/2906; H03M 13/09; H04L 1/0061; H04L 1/0041
USPC .......................................................... 714/758
See application file for complete search history.

(56) References Cited

U.S. PATENT DOCUMENTS

| | | | | |
|---|---|---|---|---|
| 5,430,447 | A * | 7/1995 | Meier | G06K 7/0008 340/10.34 |
| 5,844,918 | A * | 12/1998 | Kato | H03M 13/03 714/751 |
| 6,023,780 | A | 2/2000 | Iwatani | |
| 8,205,128 | B2 * | 6/2012 | Yoo | H04L 1/1845 714/748 |
| 8,667,357 | B2 * | 3/2014 | Park | H04L 1/1819 714/746 |
| 10,055,285 | B2 * | 8/2018 | Manning | G06F 11/108 |
| 2006/0195752 | A1 * | 8/2006 | Walker | H04L 1/0045 714/748 |
| 2010/0017692 | A1 * | 1/2010 | Kwak | H03M 13/091 714/807 |
| 2010/0205518 | A1 * | 8/2010 | Golitschek Edler von Elbwart | H03M 13/09 714/807 |
| 2011/0055652 | A1 * | 3/2011 | Park | H04L 1/1819 714/748 |
| 2015/0095737 | A1 | 4/2015 | Grimsrud et al. | |
| 2016/0164538 | A1 * | 6/2016 | Abu-Surra | H03M 13/1111 714/776 |
| 2016/0374037 | A1 * | 12/2016 | Lee | H04W 12/10 |
| 2017/0063493 | A1 * | 3/2017 | Mundhada | H03M 13/00 |

(Continued)

OTHER PUBLICATIONS

European Search Report issued in European Application No. 18187146.8, dated Dec. 4, 2018, 7 pages.

*Primary Examiner* — James C Kerveros
(74) *Attorney, Agent, or Firm* — Compass IP Law PC

(57) ABSTRACT

One embodiment provides a storage controller. The storage controller includes host data segmentation logic to divide, in response to a write command from a host domain to write a data payload to a storage device, the data payload into a plurality of data segments; cyclic redundancy check (CRC) encode logic to generate a CRC code for each data segment; and CRC reordering encode logic to assign each CRC code to another data segment among the plurality of data segments.

24 Claims, 6 Drawing Sheets

(56) References Cited

U.S. PATENT DOCUMENTS

2017/0207880 A1* 7/2017 Sun ..................... H03M 13/09
2017/0222661 A1* 8/2017 Sun ..................... H03M 13/09
2017/0250710 A1* 8/2017 Asanaka ............ H03M 13/617

* cited by examiner

DETECTING SILENT DATA CORRUPTION FOR MASS STORAGE DEVICES

FIELD

The present disclosure relates to detecting silent data corruption for mass storage devices.

BACKGROUND

A sector is the smallest granularity of storage that the host can access on a storage device. Host commands address these sectors using a Logical Block Address (LBA) where each LBA points to a particular sector. The optimal sector size (512 bytes, 1 k, 2 k, 4 k, . . . ) varies depending on the host application requirement. However, on the implementation side, hardware and media layout optimizations (for performance, resilience and cost) dictates the media sector size. Typically, a host sector size is multiples of a media sector size. Host applications require that writes be atomic. That means either the entire host sector is either committed to media, or it is not. If a read of a partially committed (torn) host sector does not return a failure, the result is a silent data corruption.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Figure 1:
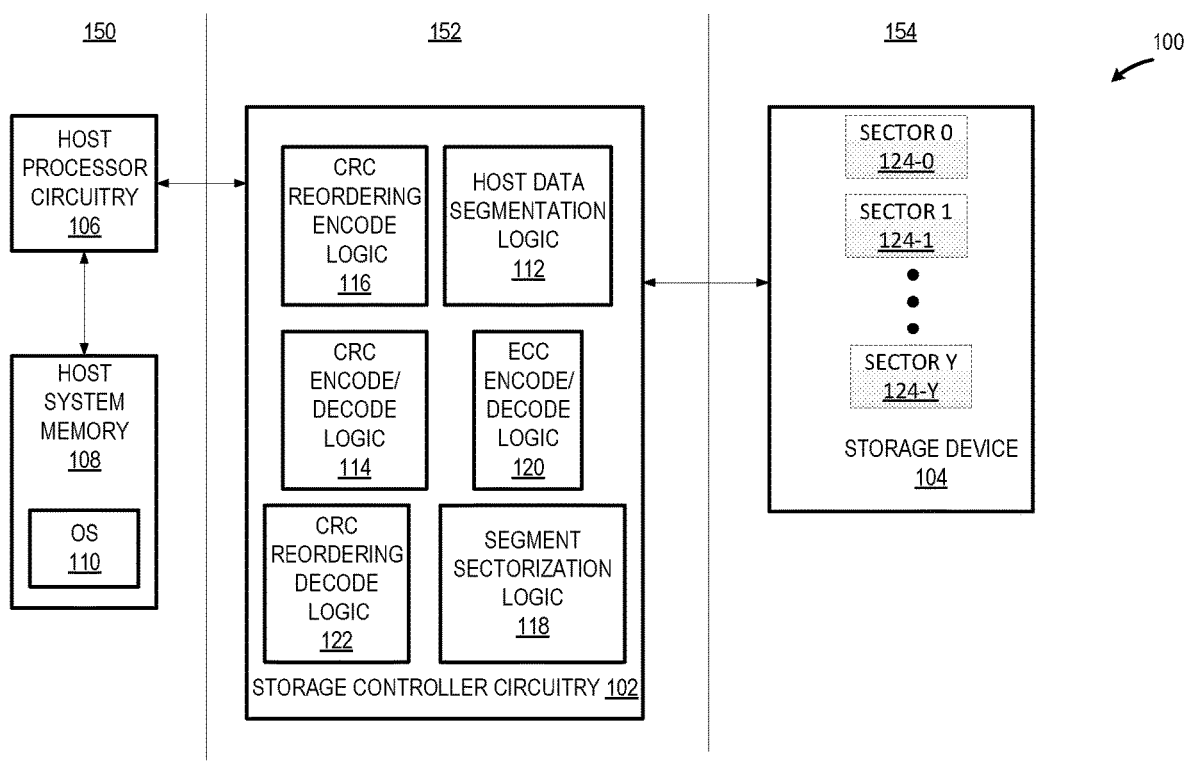
FIG. 1 illustrates a storage system consistent with several embodiments of the present disclosure.

FIG. 1 illustrates a system 100 consistent with several embodiments of the present disclosure. System 100 may include a storage controller circuitry 102, a storage device 104, host processor circuitry 106 and host system memory 108. Host system memory 108 may include volatile random-access memory, e.g., dynamic random access memory (DRAM), static random access memory (SRAM), etc. In some embodiments, storage device 104 may be formed part of, and package with, storage controller circuitry 102 as one integrated unit (which may also include memory circuitry (e.g., DRAM-type memory, not shown). Host processor circuitry 106 may correspond to a single core or a multi-core general purpose processor, such as those provided by Intel® Corp., etc. The host processor 106 and host system memory 108 may also be referred to herein as "host domain 150".

Storage device 104 may include, for example, solid state device (SSD) circuitry (e.g., non-volatile memory (NVM) circuitry), e.g., a storage medium that does not require power to maintain the state of data stored by the storage medium. Nonvolatile memory may include, but is not limited to, a NAND flash memory (e.g., a Triple Level Cell (TLC) NAND or any other type of NAND (e.g., Single Level Cell (SLC), Multi Level Cell (MLC), Quad Level Cell (QLC), etc.)), NOR memory, solid state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable cross point architecture in which memory cells sit at the intersection of words lines and bit lines and are individually addressable and in which bit storage is based on a change in bulk resistance. In other embodiments, the storage device 104 may include a hard disk drive and/or other types of mass storage devices. The storage device 104 is generally organized to include a plurality of sectors ("media sectors" or "storage device sectors") Sector 0 (124-0), Sector 1 (124-1), . . . , Sector Y (124-Y); where Y is a whole number greater than 1. The size of each media sector is generally dependent on the type of device, layout optimization, etc. The media sector size is typically fixed for a given device, for example, media sector size of 512 Bytes. The storage device 104 may also be referred to herein as "storage domain 154".

Host system memory 108 may host an operating system (OS) 110 and an associated file system (not shown). As an application (not shown) is executed by host processor circuitry 106, read and/or write operations targeting the storage device 104 may be issued by a file system associated with the OS 110. Such read and write operations typically include a logical block address (LBA) having an associated LBA sector size to be read from storage device 104 and/or written to storage device 104. In some embodiments, the LBA sector size may be a single, fixed size, e.g. 512 Bytes, and in other embodiments (as will be described below), the LBA sector size may be different for different applications/usage models. The LBA sector size, as issued by the host processor circuitry 106, is referred to herein as "host sector size". In general, the host sector size is typically multiples of the media sector size, and the length of the host sector may be based on, for example, operating environment, application demand/optimization, etc.

Storage controller circuitry 102 (hereafter "controller 102") is generally configured to control read and write operations between host processor circuitry 106 and storage device 104. Controller 102 is also referred to herein as "storage controller domain 152". To execute a read or write command, the controller 102 is generally configured to address physical sectors 124-0, 124-1, . . . , 124-Y of the storage device 104 using at least one LBA issued from the host processor circuitry 106. During a write operation controller 102 is configured to segment the host data (associated with a host sector) into a plurality of segments. The controller 102 may also be configured to further divide the segments into a plurality of media sector size data portions (sectorization), as will be described in greater detail below.

Controller 102 includes host data segmentation logic 112 generally configured to segment a data payload, issued with a write command from the host domain 150, into a plurality of smaller segments. In at least one embodiment, host data segmentation logic 112 is configured to segment the data payload into $2^N$ segments; where N is a whole number. The size of each segment may be based on, for example, processing overhead requirements for error correction calculations for the data payload (as a general matter, smaller segments require less processing overhead for error correction than larger segments). Controller 102 also includes CRC (cyclic redundancy check) encode/decode logic 114 generally configured to encode CRC code for each segment (and, during a read operation, decode the CRC code to confirm data integrity). The CRC code generated by CRC encode/decode logic 114 may include a short (e.g., 4 bits) check value that is paired with a segment. The CRC encode/decode logic 114 may generate the CRC code, for example, as a remainder of a polynomial division of a segment.

As described above, silent data corruption may occur when one segment of the data payload is properly written to a storage device, but a system interruption event (e.g., power failure, system reset, etc.) occurs before the remaining segment(s) are written to the storage device. Thus, in the conventional storage system, there will be "correct" data in the segment(s) that were written to successfully, but "stale" data in the segment(s) that were not written before the system interruption event occurred. Such "stale" data is data that typically has "correct" CRC codes for each segment (as written during a prior write operation), but the stale data is not correct for the current (partially failed) write operation. Thus, when the stale data is read, it will be "correct" in the sense that it will have correct CRC codes, but incorrect because it is not the data that was intended to be written during the failed write operation. Thus, such data may return incorrect results during a read operation, but such incorrect results will go undetected in a conventional storage system.

Accordingly, to enable detection of silent data corruption during a write operation, the controller 102 of the present embodiments also includes CRC reordering encode logic 116 generally configured to "switch" or "shift" the CRC codes of each segment during a write operation. In one embodiment, logic 116 is configured to shift the CRC code of each segment to a subsequent segment, and shift the CRC code of the last segment to the first segment. In another embodiment, logic 116 is configured to shift the CRC code of each segment to a previous segment, and shift the CRC code of the first segment to the last segment. In still other embodiments, logic 116 is configured to shift the CRC codes by some number of subsequent and/or previous segments, for example shift each CRC code to a segment that is two segments away. In still other embodiments, logic 116 is configured to shift the CRC codes randomly, while ensuring that each segment receives a "new" CRC code from another segment. Thus, and as will be described in greater detail below, when the data payload is read from the storage device 104 (during a read operation), if there was a system interruption event before all of the segments are written to memory, a CRC decode operation will produce a CRC failure of any segment(s) that were not successfully written before the system interruption event occurred, and thus, the entire data payload will be flagged as a failed read operation.

As described above, depending on the sector size of the storage device 104 and during a data write operation, each segment of the payload data (from the host domain 150) may be further divided into sector-length portions, each sector length portion having a bit length that is equal to (or less than) the size of a sector 124-0, 124-1, . . . , and/or 124-Y of the storage device 104. Accordingly, controller 102 may also include segment sectorization logic 118 generally configured to divide each segment into a plurality of sector-length portions. In at least one embodiment, segment sectorization logic 118 is configured to sectorize each segment into $2^X$ sector-sized portions; where $2^X \geq 2^N$ and X is a whole number. Of course, for some write operations, the size of each segment may match the sector size of the storage device 104, in which case no further division of the payload data may be necessary Controller 102 may also include ECC encode/decode logic 120. ECC encode decode logic 120 is configured to encode each segment and/or sector length portion with an error correction code during a write operation, and decode the error correction code during a read operation. provide error checking functionality for controller 102. For example, ECC encode/decode logic 120 may be configured to attach parity information, e.g., an ECC, to data being stored (i.e., during write operations) in storage device 104. In response to and/or as part of a read operation, the ECC encode/decode logic 120 may be further configured to determine parity checks (i.e., error syndromes) that may then be utilized to detect errors, identify the bits with errors, and/or correct data read from storage device 104. One or more techniques may be used for error correction and/or detection, e.g., Hamming codes, Reed-Solomon codes, Low Density Parity Check Codes (LDPCs), Bose-Chaudhuri-Hocquenghem (BCH) codes, etc. Of course, the listed error correction codes are merely examples and other ECCs configured to detect memory cell errors, to identify the error cells and/or to correct a number of detected errors may be utilized consistent with the present disclosure. In the context of the present disclosure, the ECC encode/decode logic 120 may be applied to read and write operations for each segment and/or sector length portion and thus, ECC encode/decode logic 120 may be configured to select an error correction scheme that is appropriately sized based on the size of a segment and/or sector-length portion.

During a write operation, and assuming that segment sectorization logic 118 has divided each segment of a data payload by $2^X$ to generate a plurality of sector-length portions, segment sectorization logic 118 may be configured to append a CRC code (determined for a segment by CRC encode/decode logic 114) to the last sector-length portion of a segment, and append a null set "spacer" to the remaining sector-length portions of that segment. Each sector-length portion may include ECC code. The "spacer" (or "pad") may have the same bit length as the CRC code, but does not operate as CRC code. Thus, in the case of a partial write where only one or more sector-length portions are written to the storage device before an interruption event occurs, a subsequent read and ECC decode operation of those sector-length portions with "spacer" CRC code will result in a data read fail.

Controller 102 also includes CRC reordering decode logic 122 generally configured to "switch back" each CRC code to each original CRC code/data segment pair during a read operation, and before CRC encode/decode logic decodes the CRC code for each segment. Thus, if one or more segments (and/or sector sized portions) failed to write during a previous write operation, the CRC code that is switched from a stale segment to a "fresh" segment will fail a CRC decode process, and the read operation will be flagged as a read fail (critical fail).

Figure 2:
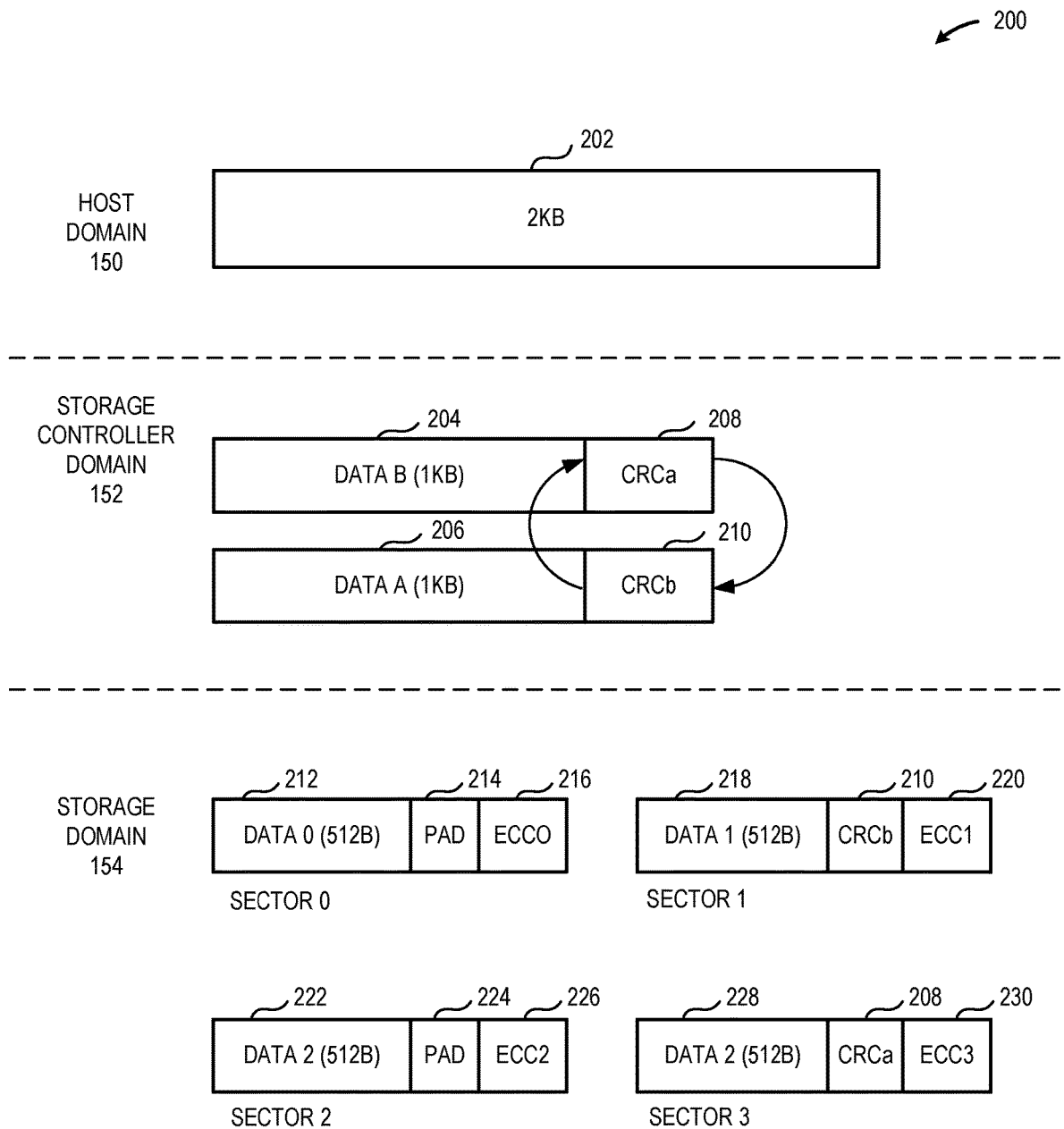
FIG. 2 illustrates a data flow example of the various domains during a data write operation according to one embodiment.

FIG. 2 illustrates a data flow example 200 of the various domains during a data write operation according to one embodiment. With continued reference to FIG. 1, in the example of FIG. 2 assume that the host domain 150 issues a write command having 2 KB data payload 202. Also, assume for this example that the storage controller domain 152 is configured to generate CRC code for 1 Kbyte segments and that the storage domain has a sector size of 512 Bytes. Accordingly, the storage controller domain 152 generates two 1 KB segments: 204 (Data B) and 206 (Data A). In addition, the storage controller domain 152 generates CRC code for each segment: CRCa 208 for segment 206 and CRCb 210 for segment 204. Prior to committing the segments 204 and 206 to the storage domain 154 and to enable silent data corruption detection, the storage controller domain 152 switches the CRC codes of each segment 204 and 206, so that CRCa 208 is appended to segment 206 and CRCb 210 is appended to segment 204, as shown by the arrows. In addition, the storage controller domain 152 may further divide each segment into sector-length portions 212, 218, 222 and 228. Portions 212 and 218 correspond to Data A segment 206, and portions 222 and 228 correspond to Data B segment 204. In addition, storage controller domain 152 is configured to generate ECC codes 216, 220, 226 and 230 and append the ECC codes to each respective portion 212, 218, 222, and 228. In addition, the storage controller domain 152 is configured to generate a spacer field 214 for the first portion 212 and a spacer field 224 for portion 222. CRCb 210 may be appended to the last portion 218 of the Data A segment 206, and CRCa may be appended to the last portion 228 of the Data B segment 204, as shown. Storage controller domain 152 may attempt to write data portion 212, the spacer field 214 and ECC code 216 to a sector of the storage domain 154 (e.g., sector 0). Storage controller domain 152 may attempt to write data portion 218, CRCb 210 and ECC code 220 to a sector of the storage domain 154 (e.g., sector 1). Storage controller domain 152 may attempt to write data portion 222, the spacer field 224 and ECC code 226 to a sector of the storage domain 154 (e.g., sector 2). Storage controller domain 152 may attempt to write data portion 228, CRCa 208 and ECC code 230 to a sector of the storage domain 154 (e.g., sector 3). Of course, in other embodiments, it may not be necessary to write each data portion to sequential sectors, and sector 0, 1, 2 and 3 may be arbitrary sectors but are depicted in FIG. 2 for purposes of illustration, not limitation.

If there is a system interruption event during these write operations, the storage controller domain 152 may detect the following data corruption scenarios during subsequent read operations (e.g., read commands issued by the host domain 150):

Scenario 1

Assume data portion 212 is partially committed (e.g., to sector 0), e.g., DataA 206 is torn. When the storage controller domain 152 reads this sector, ECC logic 120 will decode ECCO 216 and return an error. Thus, the read operation for Data A and Data B will result in a read error (fatal error).

Scenario 2

Assume data portion 212 is committed to the storage device correctly, but the interruption event occurs before data portion 218 has started to write to the storage device. In this scenario, when the storage controller domain 152 reads Sector 0, the ECC logic 120 will not detect any errors for this sector, but when the storage controller domain 152 reads Sector 1, 2 and 3 the CRC logic 120 will decode "stale" ECC codes at fields 220 and 230, and since the data in Sector 1 is "stale" the ECC codes will return a read error.

Scenario 3

Assume that Data 0 212 and Data 1 218 have been committed to the storage device correctly, but the interruption event occurs before Data 2 (222) and Data 3 (228) have started. Thus, CRCb 210 is committed, but the CRC code for Data B 204 is "stale". In this scenario, the storage controller domain 152 reads Data A 206 and Data B (from Sectors 0, 1, 2 and 3) and the CRC codes are reordered so that "stale" CRCa is appended to Data A and "new" CRCb is appended to "stale" DataB. In this manner, each CRC code will return an error, thus reducing or eliminating silent data corruption.

Figure 3:
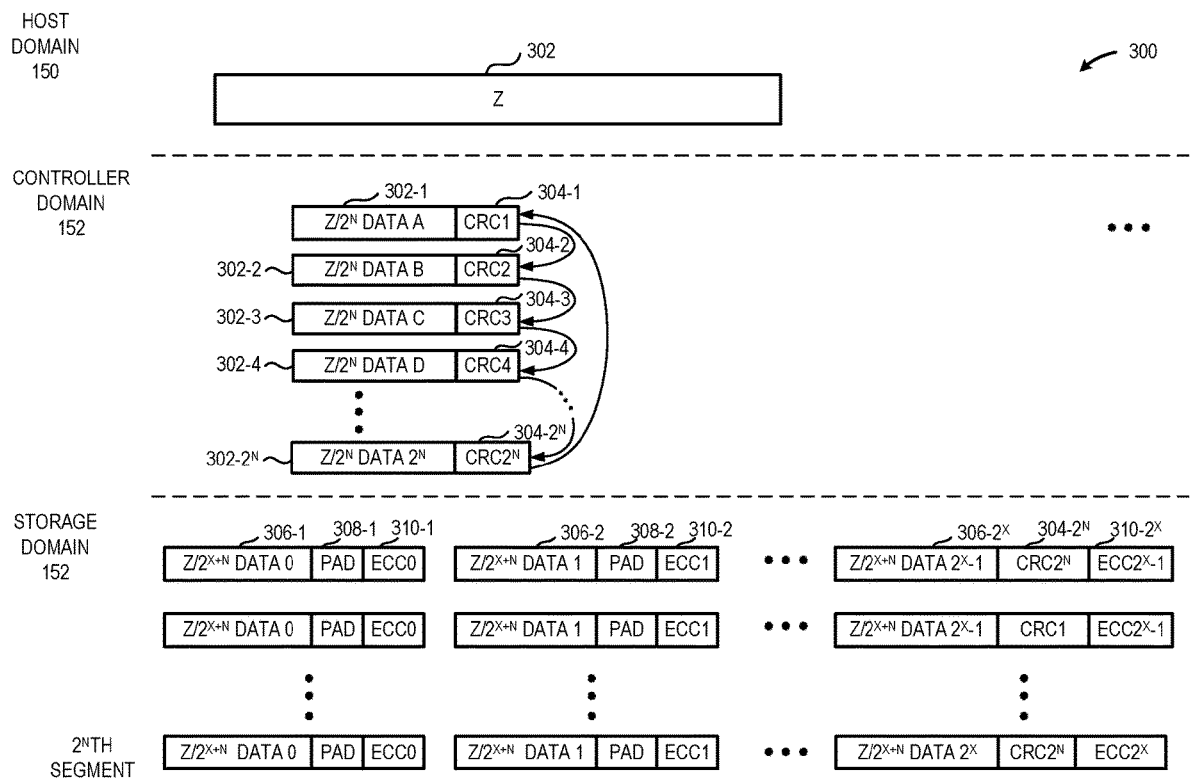
FIG. 3 illustrates a generalized data flow example according to various embodiments of the present disclosure.

FIG. 3 illustrates a generalized data flow example 300 according to various embodiments of the present disclosure. With continued reference to FIG. 1, in the example of FIG. 3 assume that the host domain 150 issues a write command having data payload 302 having a length of Z Bytes. The storage controller domain 152 is generally configured to segment the data payload into a plurality of segments 302-1, 302-3, 302-3, 302-4, . . . , 302-$2^N$; where Z>N and N is a whole number. Each segment 302-1, 302-3, 302-3, 302-4, . . . , 302-$2^N$ has a data length Z/$2^N$. The storage controller domain 152 is also configured to generate CRC codes 304-1, 304-2, 304-3, 304-4, . . . , 304-$2^N$ for each respective segment 302-1, 302-3, 302-3, 302-4, . . . , 302-$2^N$. The storage controller domain 152 is also configured to assign each CRC code to the next segment and assign the last CRC code to the first segment (as indicated by the arrows), thus enabling silent data corruption detection. The storage controller domain 152 is also configured to sectorize each segment by, at least, generating an ECC code for the segment and appending the ECC code and (switched) CRC code to each sector-length portion. More generally, and assuming that the sector length of a storage device is less than the length of each segment, the storage controller domain 152 is also configured divide each segment by $2^X$, thus generating a plurality of sector-length portions each having a length of $(Z/2^{(N+X)})$; where $2^X \geq 2^N$ and X is a whole number. For example, segment 302-1 may be divided into sector-length portions 306-1, 306-2, . . . , 306-$2^X$. Using segment 302-1 as an example, prior to committing the segments to the storage device, the storage controller domain 152 is configured to append the "switched" CRC code 310 and ECC code 310-$2^X$ to the last sector-length portion 306-$2^X$, and append null sets ("PAD" 308-1, 308-2, . . . ) and ECC codes (310-1, 310-2, . . . ) to the remaining sector-length portions. The remaining segments may be processed in a similar fashion, as depicted in FIG. 3. The generalized data flow of FIG. 3 enables the detection of silent data corruption using CRC code "shifting" or "switching", as described herein, as well as detection of other write errors using ECC codes, as described above.

Of course, the example of FIG. 3 illustrates shifting, or assigning, of CRC codes to subsequent segments, but in other embodiments, the CRC codes may be shifted to previous segments. Thus, for example, if there are 4 data segments, the CRC code for data segment 1 may be shifted to the last data segment, the CRC code for data segment 2 may be shifted to data segment 1, and so on. In still other embodiments, storage controller domain 152 may be configured to shift CRC codes by "jumping" one or more data segments. Thus, for example, if there are 8 data segments, the CRC code for data segment 1 may be shifted to data segment 3, the CRC code for data segment 2 may be shifted to data segment 4, and so on, and the CRC codes for data segments 7 and 8 may be shifted to data segments 1 and 2, respectively. Of course, these are only examples of the types of CRC shifting that may be configured to be performed by storage controller domain 152, and as a general matter, the storage controller domain 152 is generally configured to shift, or assign, CRC codes among the plurality of data segments to ensure that no original CRC code/data segment pair is committed to the storage device 104 as the original pair. Thus, in still other embodiments, storage controller domain 152 may be configured to shift, or assign, CRC codes randomly among the plurality of data segments.

Figure 4:
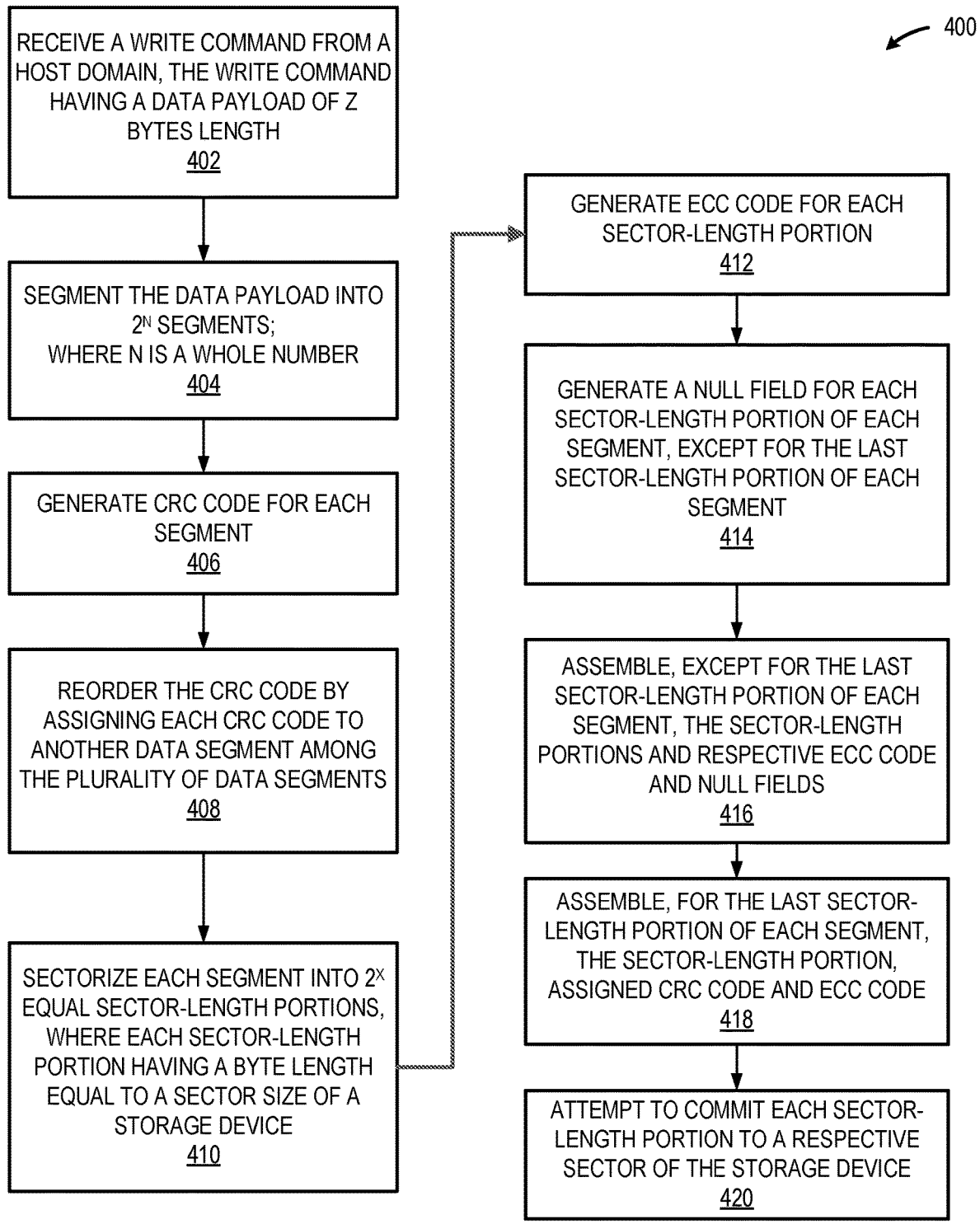
FIG. 4 is a flowchart of operations according to various embodiments of the present disclosure.

FIG. 4 is a flowchart 400 of operations according to various embodiments of the present disclosure. In particular, the flowchart 400 illustrates write operations and CRC code switching to enable silent data corruption detection. Operations include receiving a data write command from a host domain, the data write command having a data payload of Z Bytes in length 402. Operations also include segmenting the data payload into $2^N$ data segments; where N is a whole number 404. Operations also include generating CRC code for each data segment 406. Operations also include reordering the CRC code by assigning each CRC code to another data segment among the plurality of data segments 408. In some embodiments, operations may also include sectorizing each data segment into $2^X$ sector-length portions; where X is a whole number and each sector-length having a byte length of a sector of a storage device 410. Operations may also include generating an ECC code for each sector-length portion 412. Operations may also include generating a null field for each sector-length portion of a segment, except for the last sector-length portion of each segment 414. Operations also include assembling, except for the last sector-length portion of each segment, the sector-length portions and respective ECC codes and null fields 416. Operations may also include, for the last sector-length portion of each segment, assembling the last sector-length portion, assigned CRC code and ECC code 418. Operations may also include attempting to commit each sector-length portion to a respective sector of the storage device 420.

Figure 5:
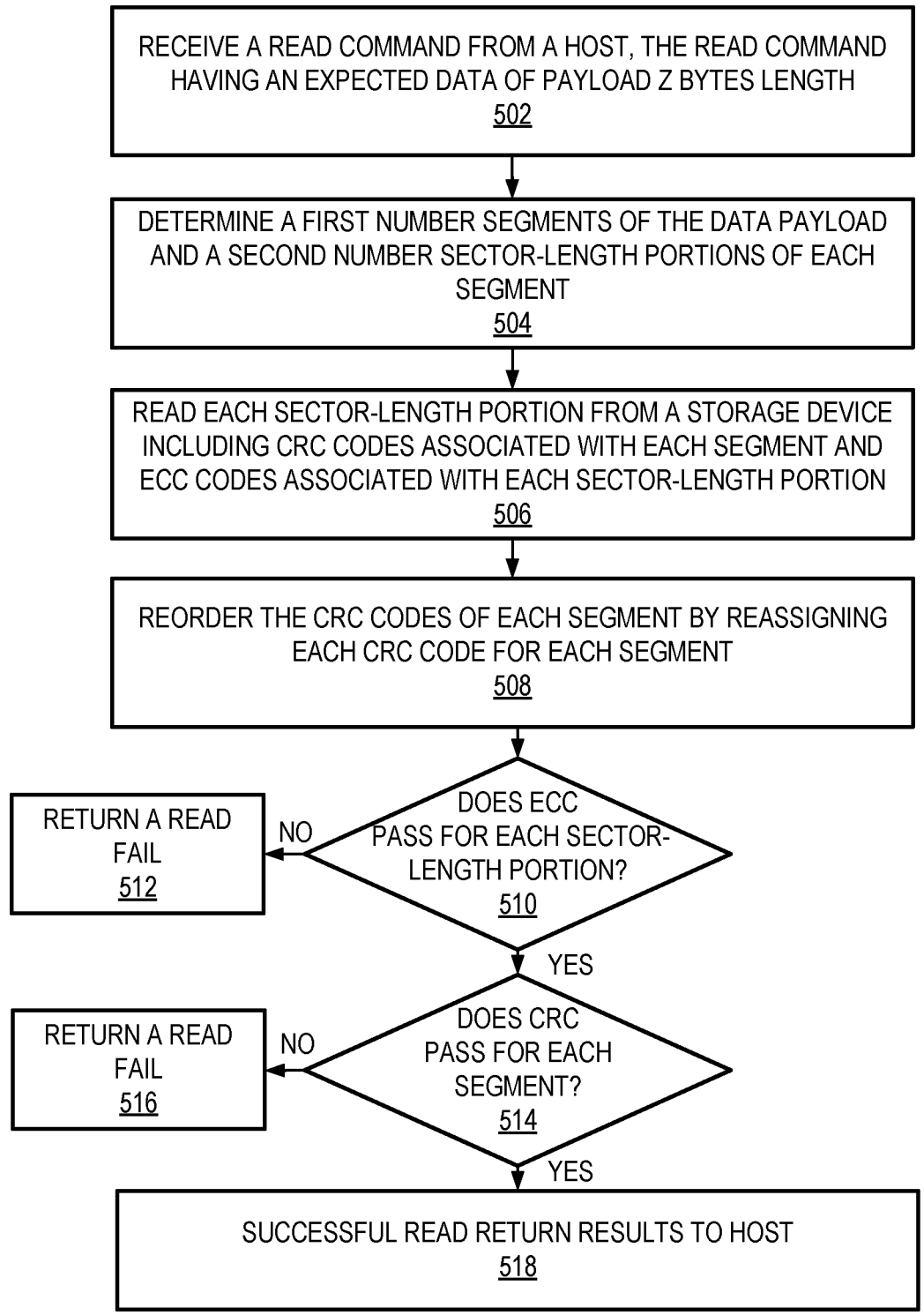
FIG. 5 is a flowchart of operations according to various embodiments of the present disclosure.

FIG. 5 is a flowchart 500 of operations according to various embodiments of the present disclosure. In particular, the flowchart 500 illustrates read operations and detection of data corruption, including silent data corruption. Operations include receiving a read command from a host, where the read command has an expected data payload of Z Bytes length 502. Operations also include determining a first number of segments of the data payload and a second number of sector-length portions of each segment 504. Operations also include reading each sector-length portion from a storage device including CRC codes associated with each segment and ECC codes associated with each sector-length portion 506. Operations also include reordering the CRC codes of each segment by reassigning each CRC code for each segment 508. Operations also include decoding the ECC code for each sector-length portion and determining if the ECC passes for each sector-length portion 510. If an ECC does not pass for a given sector-length portion, operations also include returning a read fail 512. If the ECC codes pass, operations also include operations also include decoding the CRC code for each segment and determining if the ECC passes for each segment 514. If an CRC does not pass for a given segment, operations also include returning a read fail 516. A failed CRC decode for this operation indicates silent data corruption. If both the CRC and ECC pass, operations also include returning the results of the successful read to the host 518.

Figure 6:
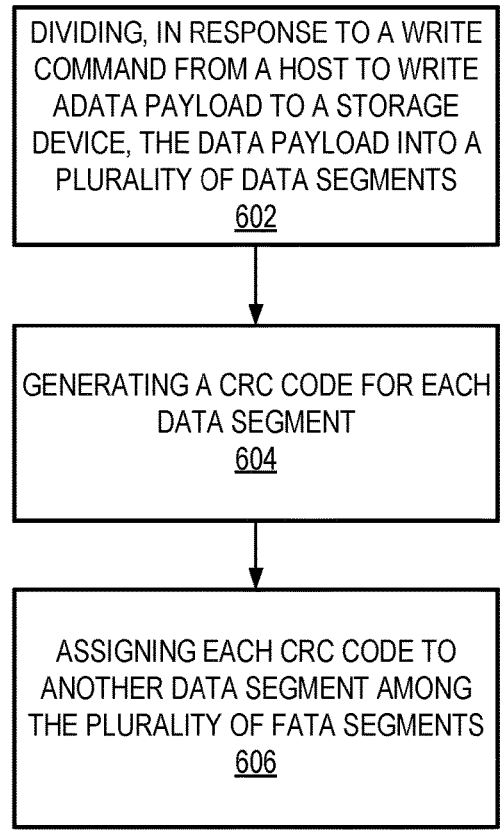
FIG. 6 is a flowchart illustrating operations consistent with one embodiment of the present disclosure.

FIG. 6 is a flowchart 600 illustrating operations consistent with one embodiment of the present disclosure. In particular, the flowchart 600 illustrates CRC code switching to enable silent data corruption detection. Operations of this embodiment include dividing, in response to a write command from a host domain to write a data payload to a storage device, the data payload into a plurality of data segments 602. Operations also include generating a CRC code for each data segment 604. Operations also include assigning each CRC code to another data segment among the plurality of data segments 606.

Figure 7:
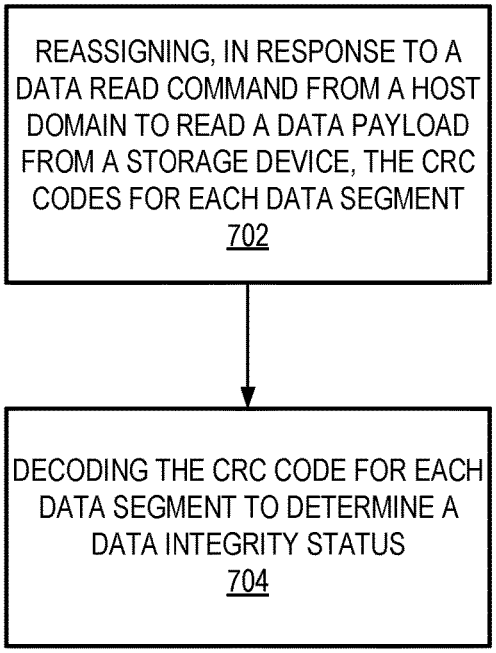
FIG. 7 is a flowchart illustrating operations consistent with one embodiment of the present disclosure.

FIG. 7 is a flowchart 700 illustrating operations consistent with one embodiment of the present disclosure. In particular, the flowchart 700 silent data corruption detection. Operations of this embodiment include reassigning, in response to a data read command from a host domain to read a data payload from a storage device, the CRC codes for each data segment 702. Operations also include decoding the CRC code for each data segment to determine a data integrity status 704.

While the flowcharts of FIGS. 4-7 illustrate operations according various embodiments, it is to be understood that not all of the operations depicted in FIGS. 4-7 are necessary for other embodiments. In addition, it is fully contemplated herein that in other embodiments of the present disclosure, the operations depicted in FIGS. 4, 5, 6 and/or 7 and/or other operations described herein may be combined in a manner not specifically shown in any of the drawings, and such embodiments may include less or more operations than are illustrated in FIGS. 4, 5, 6 and/or 7. Thus, claims directed to features and/or operations that are not exactly shown in one drawing are deemed within the scope and content of the present disclosure.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip, such as an application-specific integrated circuit (ASIC), etc. In some embodiments, the circuitry may be formed, at least in part, by a processor (e.g., host processor circuitry 106 and/or controller 102) executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the storage controller circuitry or other systems may be combined in a system-on-a-chip (SoC) architecture.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) 110 may be configured to manage system resources and control tasks that are run on, e.g., system 100. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

Memory 108 may each include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to a storage system with multiple indirection unit granularities, as discussed below.

Example 1

According to this example, there is provided a storage controller. The storage controller includes host data segmentation logic to divide, in response to a write command from a host domain to write a data payload to a storage device, the data payload into a plurality of data segments; cyclic redundancy check (CRC) encode logic to generate a CRC code for each data segment; and CRC reordering encode logic assign each CRC code to another data segment among the plurality of data segments.

Example 2

This example includes the elements of example 1, further including segment sectorization logic to divide each data segment into a plurality of sector-length portions; wherein each sector-length portion having a bit length based on a sector size of the storage device.

Example 3

This example includes the elements of example 2, further including comprising error correction code (ECC) encode logic to generate ECC code for each sector length portion.

Example 4

This example includes the elements of example 3, wherein the segment sectorization logic further to, except for the last sector-length portion of a segment, generate a null field for each sector-length portion and assemble the null field and the ECC code for each sector-length portion; and further to, for the last sector-length portion of the segment, assemble the ECC code and the assigned CRC code.

Example 5

This example includes the elements of example 1, further including CRC reordering decode logic to, in response to a data read command from the host domain to read the data payload from the storage device, reassign the CRC codes for each data segment; and CRC decode logic to decode the CRC code for each data segment to determine a data integrity status.

Example 6

This example includes the elements of example 3, further including CRC reordering decode logic to, in response to a data read command from the host domain to read the data payload from the storage device, reassign each CRC code for each data segment; CRC decode logic to decode the CRC code for each data segment to determine a first data integrity status; and ECC decode logic to decode the ECC code of each sector length portion to determine a second data integrity status.

Example 7

This example includes the elements of example 1, wherein the host data segmentation logic to divide the data payload by $2^N$; where N is a whole number.

Example 8

This example includes the elements of example 2, wherein the host data segmentation logic to divide the data payload by $2^N$; and wherein the segment sectorization logic to divide each data segment $2^{(N+X)}$; where N and X are whole numbers.

Example 9

According to this example, there is provided a method. The method includes dividing, by host data segmentation logic in response to a write command from a host domain to write a data payload to a storage device, the data payload into a plurality of data segments; generating, by cyclic redundancy check (CRC) encode logic, a CRC code for each data segment; and assigning, by CRC reordering encode logic, each CRC code to another data segment among the plurality of data segments.

Example 10

This example includes the elements of example 9, further including dividing each segment, by segment sectorization logic, into a plurality of sector-length portions; wherein each sector-length portion having a bit length based on a sector size of the storage device.

Example 11

This example includes the elements of example 10, further including generating, by error correction code (ECC) encode logic, ECC code for each sector length portion.

Example 12

This example includes the elements of example 11, further including generating, except for the last sector-length portion of a segment, a null field for each sector-length portion and assembling the null field and the ECC code for each sector-length portion; and assembling, for the last sector-length portion of the segment, the ECC code and the assigned CRC code.

Example 13

This example includes the elements of example 9, further including reassigning, in response to a data read command from the host domain to read the data payload from the storage device, the CRC codes for each data segment; and decoding, by CRC decode logic, the CRC code for each data segment to determine a data integrity status.

Example 14

This example includes the elements of example 11, further including reassigning, by CRC reordering decode logic in response to a data read command from the host domain to read the data payload from the storage device, the CRC codes for each data segment; and decoding, by CRC decode logic, the CRC code for each data segment to determine a first data integrity status; and decoding, by ECC decode logic, the ECC code of each sector length portion to determine a second data integrity status.

Example 15

This example includes the elements of example 9, wherein the host data segmentation logic to divide the data payload by $2^N$; where N is a whole number.

Example 16

This example includes the elements of example 10, wherein the host data segmentation logic to divide the data payload by $2^N$; and wherein the segment sectorization logic to divide each data segment $2^{(N+X)}$; where N and X are whole numbers.

Example 17

This example provides a storage system. The storage system includes a storage device having a plurality of sectors; and; a storage controller comprising: host data segmentation logic to divide, in response to a write command from a host domain to write a data payload to the storage device, the data payload into a plurality of data segments; cyclic redundancy check (CRC) encode logic to generate a CRC code for each data segment; and CRC reordering encode logic to assign each CRC code to another data segment among the plurality of data segments.

Example 18

This example includes the elements of example 17, further including segment sectorization logic to divide each data segment into a plurality of sector-length portions; wherein each sector-length portion having a bit length based on a sector size of the storage device.

Example 19

This example includes the elements of example 18, further including comprising error correction code (ECC) encode logic to generate ECC code for each sector length portion.

Example 20

This example includes the elements of example 19, wherein the segment sectorization logic further to, except for the last sector-length portion of a segment, generate a null field for each sector-length portion and assemble the null field and the ECC code for each sector-length portion; and further to, for the last sector-length portion of the segment, assemble the ECC code and the assigned CRC code.

Example 21

This example includes the elements of example 17, further including CRC reordering decode logic to, in response to a data read command from the host domain to read the data payload from the storage device, reassign the CRC codes for each data segment; and CRC decode logic to decode the CRC code for each data segment to determine a data integrity status.

Example 22

This example includes the elements of example 19, further including CRC reordering decode logic to, in response to a data read command from the host domain to read the data payload from the storage device, reassign each CRC code for each data segment; CRC decode logic to decode the CRC code for each data segment to determine a first data integrity status; and ECC decode logic to decode the ECC code of each sector length portion to determine a second data integrity status.

Example 23

This example includes the elements of example 17, wherein the host data segmentation logic to divide the data payload by $2^N$; where N is a whole number.

Example 24

This example includes the elements of example 18, wherein the host data segmentation logic to divide the data payload by $2^N$; and wherein the segment sectorization logic to divide each data segment $2^{(N+X)}$; where N and X are whole numbers.

Example 25

According to this example, there is provided A computer readable storage device having stored thereon instructions that when executed by one or more processors result in the following operations including dividing, in response to a write command from a host domain to write a data payload to a storage device, the data payload into a plurality of data segments; generating, a CRC code for each data segment; and assigning each CRC code to another data segment among the plurality of data segments.

Example 26

This example includes the elements of example 25, wherein the instructions that when executed by one or more processors results in the following additional operations including dividing each segment into a plurality of sector-length portions; wherein each sector-length portion having a bit length based on a sector size of the storage device.

Example 27

This example includes the elements of example 26, wherein the instructions that when executed by one or more processors results in the following additional operations including generating ECC code for each sector length portion.

Example 28

This example includes the elements of example 27, wherein the instructions that when executed by one or more processors results in the following additional operations generating, except for the last sector-length portion of a segment, a null field for each sector-length portion and assembling the null field and the ECC code for each sector-length portion; and assembling, for the last sector-length portion of the segment, the ECC code and the assigned CRC code.

Example 29

This example includes the elements of example 27, wherein the instructions that when executed by one or more processors results in the following additional operations including reassigning, in response to a data read command from the host domain to read the data payload from the storage device, the CRC codes for each data segment; and decoding the CRC code for each data segment to determine a first data integrity status; and decoding the ECC code of each sector length portion to determine a second data integrity status.

Example 30

This example includes the elements of example 25, wherein the instructions that when executed by one or more processors results in the following additional operations including reassigning, in response to a data read command from the host domain to read the data payload from the storage device, the CRC codes for each data segment; and decoding the CRC code for each data segment to determine a data integrity status.

Example 31

This example includes the elements of example 25, wherein the host data segmentation logic to divide the data payload by $2^N$; where N is a whole number.

Example 32

This example includes the elements of example 26, wherein the host data segmentation logic to divide the data payload by $2^N$; and wherein the segment sectorization logic to divide each data segment $2^{(N+X)}$; where N and X are whole numbers.

Example 33

This example includes the elements of example 1, wherein assigning each CRC code to another data segment includes assigning each CRC code to a subsequent data segment and assigning the CRC code of the last data segment to the first data segment.

Example 34

This example includes the elements of example 1, wherein assigning each CRC code to another data segment includes assigning each CRC code to a previous data segment and assigning the CRC code of the first data segment to the last data segment.

Example 35

This example includes the elements of example 1, wherein assigning each CRC code to another data segment includes randomly assigning each CRC code to another data segment.

Example 36

This example includes the elements of example 9, wherein assigning each CRC code to another data segment includes assigning each CRC code to a subsequent data segment and assigning the CRC code of the last data segment to the first data segment.

Example 37

This example includes the elements of example 9, wherein assigning each CRC code to another data segment includes assigning each CRC code to a previous data segment and assigning the CRC code of the first data segment to the last data segment.

Example 38

This example includes the elements of example 9, wherein assigning each CRC code to another data segment includes randomly assigning each CRC code to another data segment.

Example 39

This example includes the elements of example 17, wherein assigning each CRC code to another data segment includes assigning each CRC code to a subsequent data segment and assigning the CRC code of the last data segment to the first data segment.

Example 40

This example includes the elements of example 17, wherein assigning each CRC code to another data segment includes assigning each CRC code to a previous data segment and assigning the CRC code of the first data segment to the last data segment.

Example 41

This example includes the elements of example 17, wherein assigning each CRC code to another data segment includes randomly assigning each CRC code to another data segment.

Example 42

This example includes the elements of example 25, wherein assigning each CRC code to another data segment includes assigning each CRC code to a subsequent data segment and assigning the CRC code of the last data segment to the first data segment.

Example 43

This example includes the elements of example 25, wherein assigning each CRC code to another data segment includes assigning each CRC code to a previous data segment and assigning the CRC code of the first data segment to the last data segment.

Example 44

This example includes the elements of example 25, wherein assigning each CRC code to another data segment includes randomly assigning each CRC code to another data segment.

Example 45

This example provides a storage system. The storage system includes: a storage domain comprising a storage device having storage media that includes a plurality of sectors; and
 a storage controller domain comprising:
  host data segmentation logic to divide, in response to a write command from a host domain to write a data payload to a storage device, the data payload into a plurality of data segments;
  cyclic redundancy check (CRC) encode logic to generate a CRC code for each data segment; and
  CRC reordering encode logic assign each CRC code to another data segment among the plurality of data segments.

Example 46

This example includes the elements of example 45, further including segment sectorization logic to divide each data segment into a plurality of sector-length portions; wherein each sector-length portion having a bit length based on a sector size of the storage device.

Example 47

This example includes the elements of example 46, further including comprising error correction code (ECC) encode logic to generate ECC code for each sector length portion.

Example 48

This example includes the elements of example 47, wherein the segment sectorization logic further to, except for the last sector-length portion of a segment, generate a null field for each sector-length portion and assemble the null field and the ECC code for each sector-length portion; and further to, for the last sector-length portion of the segment, assemble the ECC code and the assigned CRC code.

Example 49

This example includes the elements of example 45, further including CRC reordering decode logic to, in response to a data read command from the host domain to read the data payload from the storage device, reassign the CRC codes for each data segment; and CRC decode logic to decode the CRC code for each data segment to determine a data integrity status.

Example 50

This example includes the elements of example 47, further including CRC reordering decode logic to, in response to a data read command from the host domain to read the data payload from the storage device, reassign each CRC code for each data segment; CRC decode logic to decode the CRC code for each data segment to determine a first data integrity status; and ECC decode logic to decode the ECC code of each sector length portion to determine a second data integrity status.

Example 51

This example includes the elements of example 45, wherein the host data segmentation logic to divide the data payload by $2^N$; where N is a whole number.

Example 52

This example includes the elements of example 46, wherein the host data segmentation logic to divide the data payload by $2^N$; and wherein the segment sectorization logic to divide each data segment $2^{(N+X)}$; where N and X are whole numbers.

Example 53

This example includes the elements of example 45, wherein assigning each CRC code to another data segment includes assigning each CRC code to a subsequent data segment and assigning the CRC code of the last data segment to the first data segment.

Example 54

This example includes the elements of example 45, wherein assigning each CRC code to another data segment includes assigning each CRC code to a previous data segment and assigning the CRC code of the first data segment to the last data segment.

Example 55

This example includes the elements of example 45, wherein assigning each CRC code to another data segment includes randomly assigning each CRC code to another data segment.

Example 56

This example includes a system including comprising at least one device arranged to perform the method of any one of examples 9 to 16, or any one of examples 36-38

Example 57

This example includes means to perform the method of any one of examples 9 to 16, or any one of examples 36-38.

Example 58

This example includes a computer readable storage device having stored thereon instructions that when executed by one or more processors result in the following operations including the method according to any one of examples 9 to 16, or any one of examples 36-38.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A storage controller, comprising:
host data segmentation circuitry to divide a data payload into a plurality of data segments, in response to a write command from a host domain to write the data payload to a storage device;
cyclic redundancy check (CRC) encode circuitry to generate a plurality of CRC codes, each of the plurality of CRC codes originally paired with a corresponding one of the plurality of data segments;
CRC reordering encode circuitry to shift each of the plurality of CRC codes to pair with a new data segment different from an originally paired data segment, including any of a subsequent data segment, previous data segment, and random data segment relative to the originally paired data segment; and
wherein, based on one or more shifted CRC codes, CRC decode circuitry will produce a CRC failure of all of the plurality of data segments, including data segments that were successfully written, if any of the plurality of data segments of the data payload were not successfully written before a system interruption event occurred.

2. The storage controller of claim 1, further comprising segment sectorization circuitry to divide each of the plurality of data segments into a plurality of sector-length portions; wherein each sector-length portion having a bit length based on a sector size of the storage device.

3. The storage controller of claim 2, further comprising error correction code (ECC) encode circuitry to generate ECC code for each sector-length portion.

4. The storage controller of claim 2, wherein the host data segmentation circuitry to divide the data payload by $2^N$; and wherein the segment sectorization circuitry to divide each data segment by $2^{(N+X)}$; where N and X are whole numbers.

5. The storage controller of claim 3, wherein the segment sectorization circuitry further to, except for the last sector-length portion of a data segment, generate a null field for each sector-length portion and assemble the null field and the ECC code for each sector-length portion; and further to, for the last sector-length portion of the segment, assemble the ECC code and a CRC code from the originally paired data segment.

6. The storage controller of claim 3, further comprising:
CRC reordering decode circuitry to, in response to a data read command from the host domain to read the data payload from the storage device, reassign a shifted CRC code to the originally paired data segment;
CRC decode circuitry to decode a reassigned CRC code for each data segment to determine a first data integrity status; and
ECC decode circuitry to decode the ECC code of each sector-length portion to determine a second data integrity status.

7. The storage controller of claim 1, further comprising:
CRC reordering decode circuitry to, in response to a data read command from the host domain to read the data payload from the storage device, reassign a shifted CRC code to the originally paired data segment; and
CRC decode circuitry to decode a reassigned CRC code for each data segment to determine a data integrity status.

8. The storage controller of claim 1, wherein the host data segmentation circuitry to divide the data payload by $2^N$; where N is a whole number.

9. A method comprising:
dividing, by host data segmentation circuitry, in response to a write command from a host domain to write a data payload to a storage device, the data payload into a plurality of data segments;
generating, by cyclic redundancy check (CRC) encode circuitry, a plurality of cyclic redundancy check (CRC) codes, each of the plurality of CRC codes originally paired with a corresponding one of the plurality of data segments; and
shifting, by CRC reordering encode circuitry, each of the plurality of CRC codes to pair with a new data segment different from an originally paired data segment, including any of a subsequent data segment, previous data segment, and random data segment relative to the originally paired data segment; and
producing based on one or more shifted CRC codes, by CRC decode circuitry, a CRC failure of all of the plurality of data segments, including data segments that were successfully written, if any of the plurality of data segments of the data payload were not successfully written before a system interruption event occurred.

10. The method of claim 9, further comprising:
dividing each of the plurality of data segments into a plurality of sector-length portions;
wherein each sector-length portion having a bit length based on a sector size of the storage device.

11. The method of claim 10, comprising dividing the data payload by $2^N$; and dividing each data segment by $2^{(N+X)}$; where N and X are whole numbers.

12. The method of claim 10, further comprising generating error correction code (ECC) code for each sector-length portion.

13. The method of claim 12, further comprising:
generating, except for the last sector-length portion of a data segment, a null field for each sector-length portion and assembling the null field and the ECC code for each sector-length portion; and
assembling, for the last sector-length portion of the data segment, the ECC code and a CRC code from the originally paired data segment.

14. The method of claim 13, further comprising:
reassigning, in response to a data read command from the host domain to read the data payload from the storage device, a shifted CRC code to the originally paired data segment; and
decoding a reassigned CRC code for each data segment to determine a first data integrity status; and
decoding the ECC code of each sector-length portion to determine a second data integrity status.

15. The method of claim 9, further comprising:
reassigning, in response to a data read command from the host domain to read the data payload from the storage device, a shifted CRC code to the originally paired data segment; and
decoding a reassigned CRC code for each data segment to determine a data integrity status.

16. The method of claim 9, comprising dividing the data payload by $2^N$; where N is a whole number.

17. A storage system, comprising:
a storage device having a plurality of sectors; and;
a storage controller comprising:
host data segmentation circuitry to divide a data payload into a plurality of data segments, in response to a write command from a host domain to write the data payload to the storage device;
cyclic redundancy check (CRC) encode circuitry to generate a plurality of CRC codes, each of the plurality of CRC codes originally paired with a corresponding one of the plurality of data segments;
CRC reordering encode circuitry to shift each of the plurality of CRC codes to pair with a new data segment different from an originally paired data segment, including any of a subsequent data segment, previous data segment, and random data segment relative to the originally paired data segment; and
wherein, based on one or more shifted CRC codes, CRC decode circuitry will produce a CRC failure of all of the plurality of data segments, including data segments that were successfully written, if any of the plurality of data segments of the data payload were not successfully written before a system interruption event occurred.

18. The storage system of claim 17, further comprising segment sectorization circuitry to divide each of the plurality of data segments into a plurality of sector-length portions;
wherein each sector-length portion having a bit length based on a sector size of the storage device.

19. The storage system of claim 18, further comprising error correction code (ECC) encode circuitry to generate ECC code for each sector-length portion.

20. The storage system of claim 19, wherein the segment sectorization circuitry further to, except for the last sector-length portion of a data segment, generate a null field for each sector-length portion and assemble the null field and the ECC code for each sector-length portion; and further to, for the last sector-length portion of the data segment, assemble the ECC code and a CRC code from the originally paired data segment.

21. The storage system of claim 18, wherein the host data segmentation circuitry to divide the data payload by $2^N$; and wherein the segment sectorization circuitry to divide each data segment by $2^{(N+X)}$; where N and X are whole numbers.

22. The storage system of claim 19, further comprising:
CRC reordering decode circuitry to, in response to a data read command from the host domain to read the data payload from the storage device, reassign a shifted CRC code to the originally paired data segment;
CRC decode circuitry to decode a reassigned CRC code for each respective one of the plurality of data segments to determine a first data integrity status; and
ECC decode circuitry to decode the ECC code of each sector-length portion to determine a second data integrity status.

23. The storage system of claim 17, further comprising:
CRC reordering decode circuitry to, in response to a data read command from the host domain to read the data payload from the storage device, reassign a shifted CRC code to the originally paired data segment; and CRC decode circuitry to decode a reassigned CRC code for each data segment to determine a data integrity status.

24. The storage system of claim 17, wherein the host data segmentation circuitry to divide the data payload by $2^N$; where N is a whole number.

\* \* \* \* \*